(12) United States Patent
Komori

(10) Patent No.: US 6,924,501 B2
(45) Date of Patent: Aug. 2, 2005

(54) QUANTUM LOGIC GATE AND QUANTUM LOGIC OPERATION METHOD USING EXCITON

(75) Inventor: Kazuhiro Komori, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 216 days.

(21) Appl. No.: 10/254,808

(22) Filed: Sep. 26, 2002

(65) Prior Publication Data

US 2003/0057415 A1 Mar. 27, 2003

(30) Foreign Application Priority Data

Sep. 27, 2001 (JP) ......................................... 2001-298076
Sep. 11, 2002 (JP) ......................................... 2002-265898

(51) Int. Cl.[7] ............................................. H01L 29/06
(52) U.S. Cl. .............................. 257/14; 257/12; 257/15; 257/17; 257/21; 257/25; 257/31
(58) Field of Search .............................. 257/12, 14, 15, 257/17, 21, 25, 31

(56) References Cited

U.S. PATENT DOCUMENTS

| | | | |
|---|---|---|---|
| 4,038,976 A | | 8/1977 | Hardy et al. |
| 5,047,822 A | * | 9/1991 | Little et al. .................. 359/321 |
| 5,646,418 A | * | 7/1997 | Frazier et al. .................. 257/4 |
| 5,714,765 A | * | 2/1998 | Noetzel et al. ................ 257/17 |
| 5,770,866 A | * | 6/1998 | Kim et al. ..................... 257/25 |
| 5,777,347 A | * | 7/1998 | Bartelink ...................... 257/24 |

FOREIGN PATENT DOCUMENTS

| | | |
|---|---|---|
| JP | 60-116325 | 6/1985 |
| JP | 61-43057 | 9/1986 |
| JP | 4-279146 | 10/1992 |

OTHER PUBLICATIONS

Adriano Barenco et al., "Conditional Quantum Dynamics and Logic Gates," Physical Review Letters, vol. 74, pp. 4083–4086, May 15, 1995.

Gang Chen et al., Optically Induced Entanglement of Ecitons in a Single Quantum Dot, Science Reprint, vol. 282, pp. 1473–1476, Nov. 20, 1998.

N.H. Bonadeo et al., Coherent Optical Control of the Quantum State of a Single Quantum Dot, Science Reprint, vol. 282, pp. 1473–1476, Nov. 20, 1998.

* cited by examiner

Primary Examiner—David Zarneke
Assistant Examiner—Doug Menz
(74) Attorney, Agent, or Firm—Venable LLP; Catherine M. Voorhees

(57) ABSTRACT

A quantum logic gate utilizes an inter-polarization (dipole-dipole) interaction between excitons having polarization in semiconductor quantum well structures, or a spin exchange interaction between spin polarized excitons in the semiconductor quantum well structures. Problems associated with conventional semiconductor quantum well structures are solved in that a phase relaxation time is very short because of using inter-subband electrons, and that there is no usable ultrashort optical pulse laser technology because a subband transition wavelength is in a far-infrared region and hence ultra fast control is impossible.

11 Claims, 16 Drawing Sheets

CONTROLLED NOT

| INPUT | | OUTPUT | |
|---|---|---|---|
| $|a\rangle$ | $|b\rangle$ | $|a'\rangle$ | $|b'\rangle$ |
| $|0\rangle$ | $|0\rangle$ | $|0\rangle$ | $|0\rangle$ |
| $|0\rangle$ | $|1\rangle$ | $|0\rangle$ | $|1\rangle$ |
| $|1\rangle$ | $|0\rangle$ | $|1\rangle$ | $|1\rangle$ |
| $|1\rangle$ | $|1\rangle$ | $|1\rangle$ | $|0\rangle$ |

FIG.2A  FIG.2B

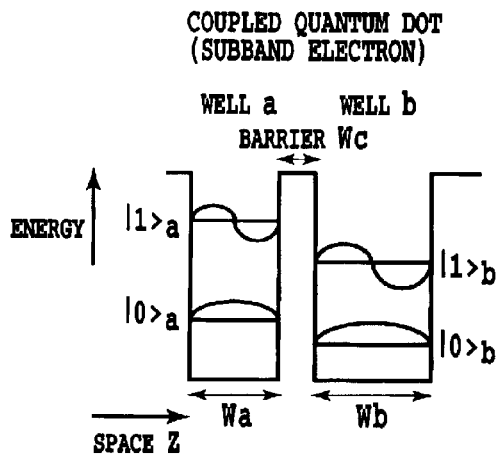
FIG.5A
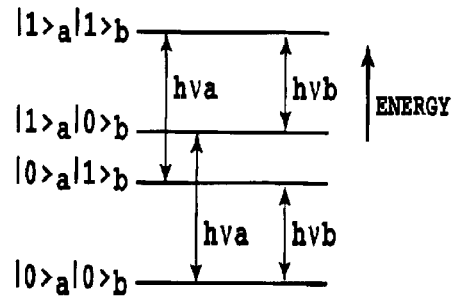
FIG.5B
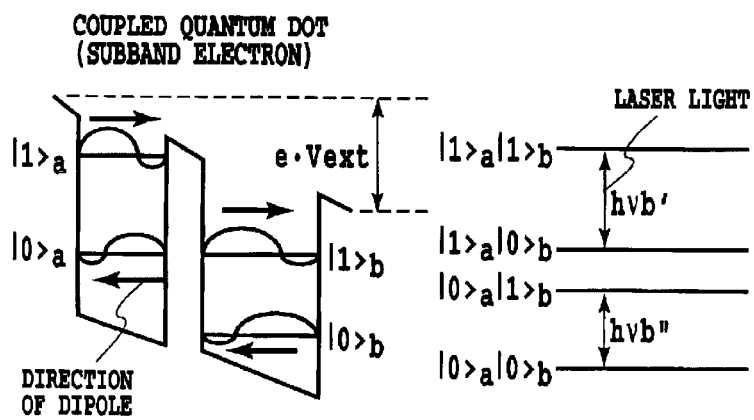
FIG.5C
FIG.5D

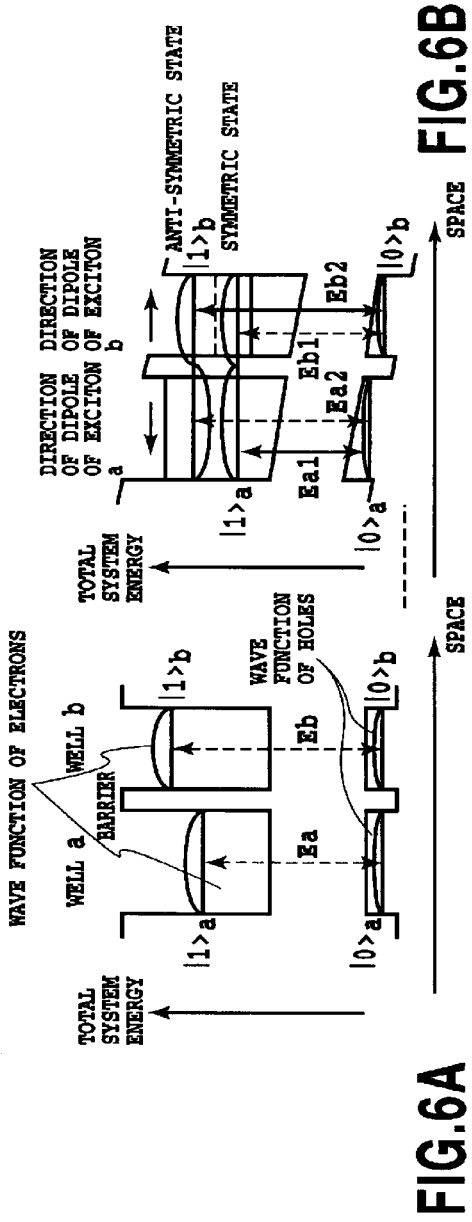
FIG.6A
FIG.6B
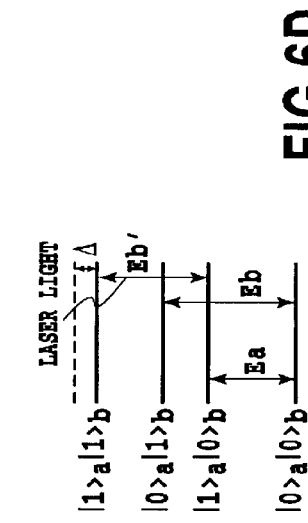
FIG.6C
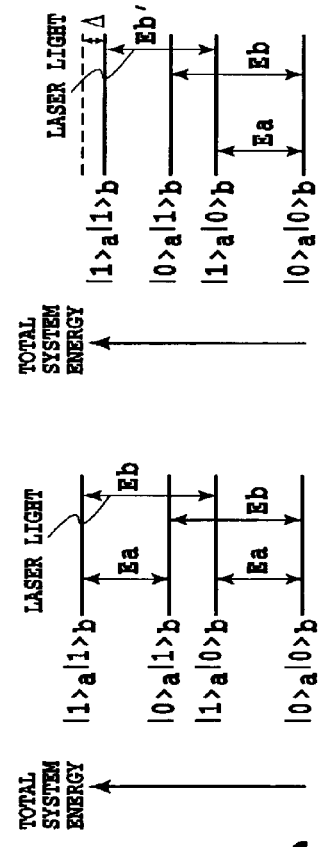
FIG.6D

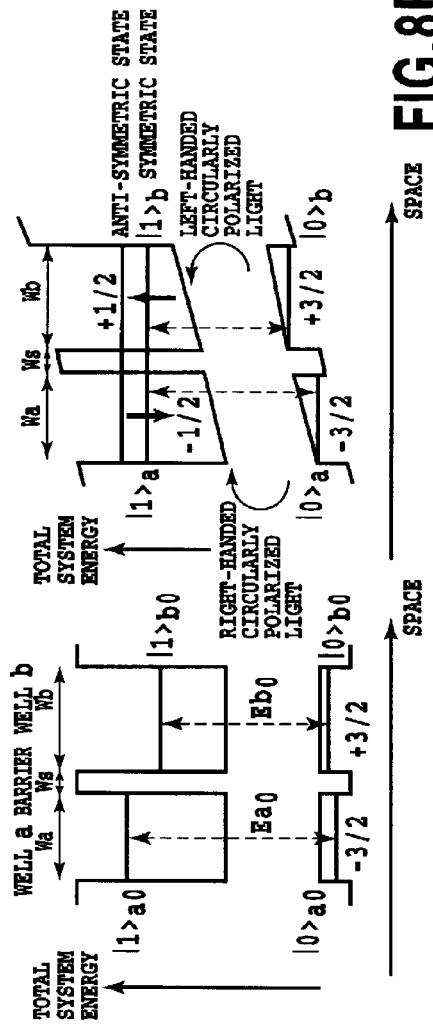
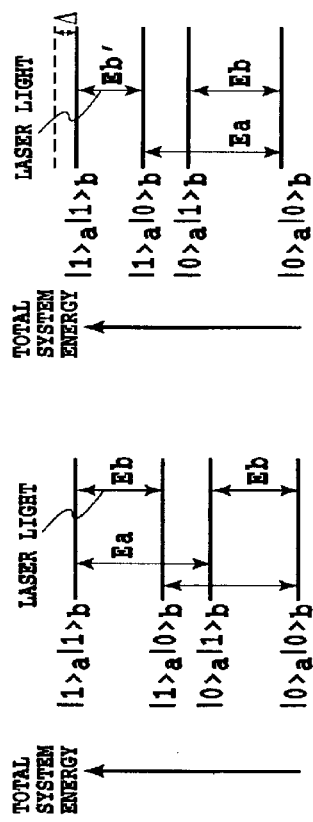
FIG.8A   FIG.8B   FIG.8C   FIG.8D

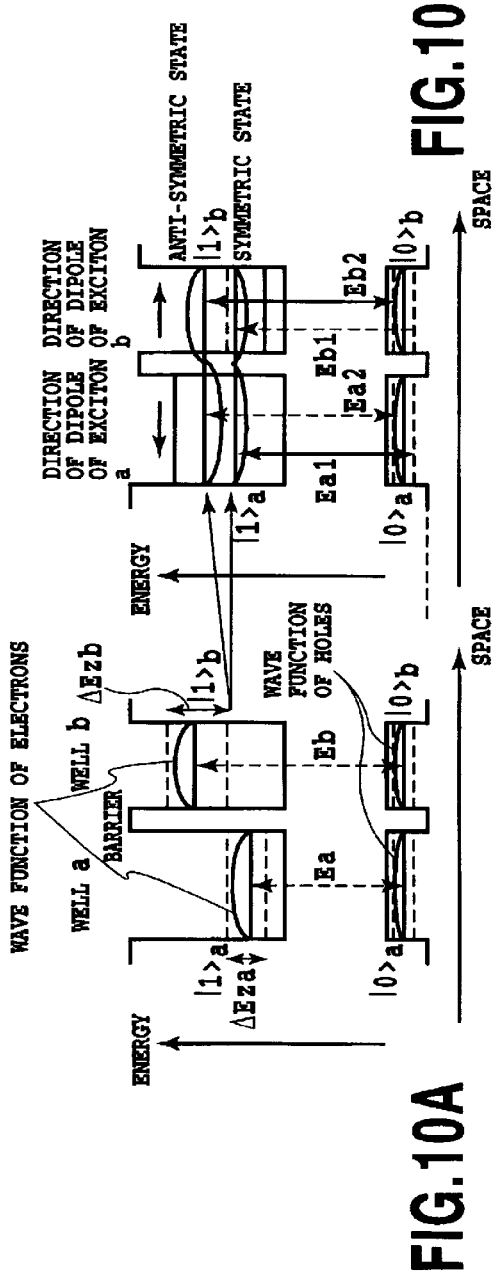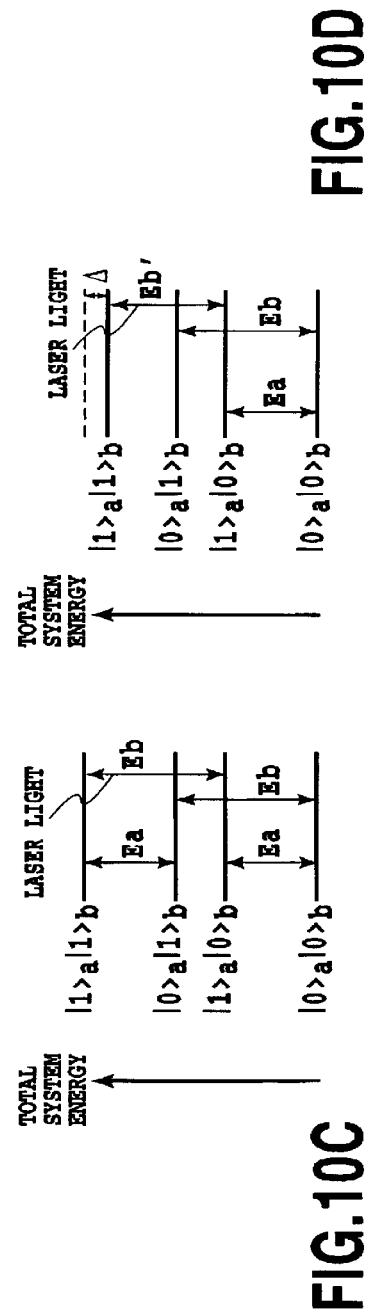

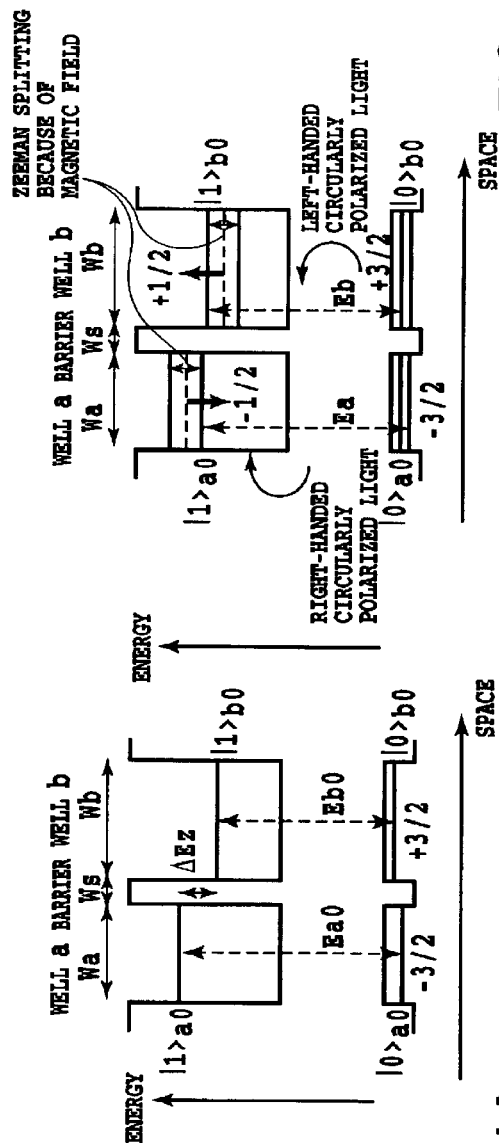
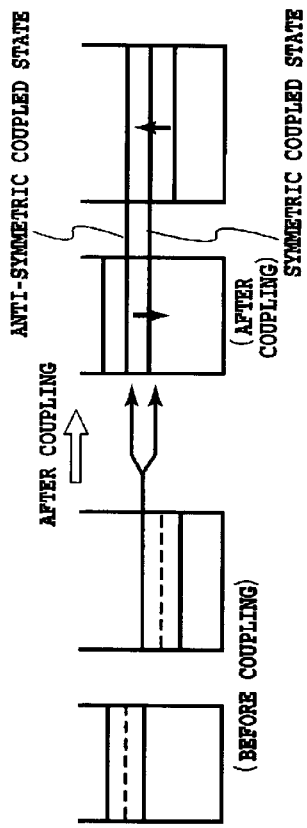
FIG.11A
FIG.11B
FIG.11C

QUANTUM LOGIC GATE AND QUANTUM LOGIC OPERATION METHOD USING EXCITON

This application is based on patent application Nos. 2001-298076 filed Sep. 27, 2001 and 2002-265898 filed Sep. 11, 2002 in Japan, the content of which is incorporated hereinto by reference.

BACKGROUND OF THE INVENTION

1. Field of the Invention

Entirely new quantum computers based on the quantum mechanics have been proposed with the expectation that they achieve a breakthrough in performance compared with the conventional computers based on the classical mechanics. The present invention relates to a basic logic gate for quantum computers, and particularly to a basic logic gate using a semiconductor quantum structure.

2. Description of the Related Art

In contrast to present computers based on the classical mechanics, quantum computers based on the principle of the quantum mechanics are proposed, and researches have been continued theoretically, that is, in respect to the software of the quantum computation so to speak. As for the hardware, however, conditions for implementing quantum logic gates physically are very severe, and hence the realization of them is still under development.

First, the principle of the quantum computation will be described. The conventional classical digital computer uses bits consisting of "0" and "1" as a basic computation element. In contrast, the quantum computer utilizes quantum bits consisting of two quantum states |0> and |1> that can assume superposition state.

For example, a particular quantum bit |a> is represented as follows.

$$|a\rangle = \cos\theta|0\rangle + \sin\theta\cdot\exp(i\alpha)|1\rangle \quad (1)$$

where α is a phase between |0> and |1>, and θ represents probability distribution of the states |0> and |1>. In other words, observing |a> will involve detecting |0> and |1> at ratios of $\cos^2\theta$ and $\sin^2\theta$, respectively.

In 1995, Deutsh et. al. showed that combinations of two types of gates, "phase shifters" and "controlled Nots", enable every logic operation of the quantum bits. Here, the phase shifter shifts the ratio (θ) of |0> and |1> and the phase α by a given amount as illustrated in FIG. 1. The controlled Not is a quantum gate concerning two quantum bits as illustrated in FIG. 2A, in which a first quantum bit is a control bit |a>, and a second quantum bit is a target quantum bit |b>. FIG. 2B is the truth table of its input/output signals. As for the operation of the controlled Not, although the target quantum bit |b> does not vary when the control quantum bit |a> is |0>, it works as a not gate that switches the target quantum bit |b> from |0> to |1> or vice versa when the control quantum bit |a> is |1>.

Since the quantum computation carries out the computation utilizing a "superposition state" in which the phase relationships between the quantum states have the quantum mechanical correlation, it must hold the "superposition state" during the computation. In an actual physical system, however, the superposition state is corrupted by decoherence factor (relaxation phenomenon) that disturbs the phase relationships (coherence). The relaxation phenomenon includes the phase relaxation (lateral relaxation) that disturbs the momentum of the system, and the energy relaxation (longitudinal relaxation) that disturbs the energy of the system. Among the two types of the relaxation, the phase relaxation occurs first, followed by the energy relaxation. In the system where the energy relaxation occurs very rapidly, the phase relaxation period becomes nearly equal to the energy relaxation period. The decoherence factor in a solid is mainly governed by the phase relaxation. Consequently, it is necessary to select a system with sufficiently long phase relaxation time, and to carry out the quantum computation in a much shorter time period than the phase relaxation time.

For this reason, to implement the quantum logic gates, the following conditions must be met: First, a system which has a long decoherence time, the time the coherence term takes to decay by a factor of e (the base of the natural logarithms), must be selected, and in which system the decoherence time (phase relaxation time) is much longer than the quantum operation time (basic gate time×the number of computations); and second, the elements essential for the quantum operation, that is, a one-quantum logic gate "phase shifter" and a two-quantum logic gate "controlled Not" must be constructed.

Not a few proposals of the quantum logic gates utilizing various types of physical systems have been made, and some of them report experimental examples with one to several quantum bits in early stages. Some representative examples are quantum computations utilizing 1) NMR, 2) ion trap, 3) linear optical system, and 4) semiconductor solid-state device.

As for 1) and 2), they are characterized in utilizing an atomic or molecular system with a very long decoherence time and experimental examples with one to several quantum bits are reported. However, it is considered that the number of the bits of the operation is limited to a few quantum bits in the quantum computation utilizing the NMR, and to several quantum bits in the quantum computation utilizing the ion trap. Accordingly, they are unsuitable for large-scale computations that make full use of the characteristics of the quantum computation. In addition, since the quantum computation utilizing a linear optical system increases its scale with the number of the quantum bits, its computation performance is also limited to several quantum bits.

Thus, the quantum computation utilizing the semiconductor solid-state device of 4) is considered to be particularly promising to implement the large-scale quantum computation. As the quantum computation utilizing the semiconductor solid-state device, there are those using 4-1) a superconducting tunnel junction; 4-2) an impurity nuclear spin; and 4-3) an electronic state of a semiconductor quantum well structure.

As the quantum computation utilizing the electronic state of the semiconductor quantum well structure, Barenco proposal is made (A. Barenco, D. Deutsch, and A. Ekert, Phys. Rev. Lett., 74, 4083 (1995)). It will be described below.

First, the quantum well structure is a structure as shown in FIG. 3. It includes an alternate stack of semiconductor layers with a large energy gap such as AlGaAs and semiconductor layers with a small energy gap such as GaAs, and builds a well-type energy barrier for electrons and holes by sandwiching the semiconductor layers with the small energy gap by the semiconductor layers with the large energy gap, thereby confining the electrons and holes in the well. Since the structure is composed of different semiconductors, it is called a semiconductor hetero-structure, and the growth interface of the two semiconductors is called a hetero-interface.

In such a quantum well structure, since the electrons are confined only in its stack direction (Z direction), they have two degrees of freedom with losing the degree of freedom in the Z direction. Thus, the quantum well structure is called a two-dimensional semiconductor or quantum film structure (see, FIG. 4A). Confining the electrons in one more direction X or Y using the semiconductors with different energy gaps will result in a one-dimensional semiconductor or quantum wire structure with losing one more degree of freedom (see, FIG. 4B). Confining the electrons in the remaining two directions X and Y besides the Z direction using the semiconductors with different energy gaps will result in the zero-dimensional semiconductor or quantum dot or quantum box structure with losing the degree of freedom in all the directions X, Y and Z (see, FIG. 4C). The two-dimensional, one-dimensional and zero-dimensional semiconductor structures are called a low-dimensional quantum well structure in contrast with the three-dimensional bulk structure.

It is possible for the quantum dot structure to exclude higher order wave functions from all the wave functions (to cut off the higher order wave functions) by reducing the width (size) of each well confining the electrons to a very small size (on the order of a few nanometers) in all the three directions X, Y and Z. Thus, it can confine a single electron in each quantum dot. In addition, selecting the size of the dot makes it possible to fabricate the quantum dot structure with only the ground state and first excited state.

FIGS. 5A–5D are energy band diagrams illustrating the Barenco proposal. As illustrated in FIG. 5A, a structure is prepared which includes two adjacent quantum well structures a and b with different widths. In particular, to carry out the excitation control of a single electron, the quantum well is preferably a quantum dot that confines the electron in the three directions. As for the electronic states |a> and |b> confined in the quantum wells a and b, their ground states are denoted by |0>a and |0>b, and their first excited states by |1>a and |1>b. FIG. 5B illustrates the energy levels in this case. Here, the indication |0>a|0>b represents that the electrons of both the wells a and b are in the ground state; |0>a|1>b represents that the electron of the well a is in the ground state and the electron of the well b is in the first excited state; |1>a|0>b represents that the electron of the well a is in the first excited state and the electron of the well b is in the ground state; and |1>a|1>b represents that the electrons of both the wells a and b are in the first excited state.

Irradiating the wells in this state with the electromagnetic wave with the energy corresponding to the energy difference $E_b$ (=$\hbar\omega_b/2\pi$=$h\nu_b$) between the two states |0>b and |1>b for a fixed time (time corresponding to a π pulse) can change the state |b> from |0>b to |1>b, or vice versa, thereby implementing the operation of the phase shifter. However, the operation of the controlled Not that changes the state |b> in response to the state |a> is unachievable.

In the Barenco proposal, the band structure of the quantum wells is inclined as illustrated in FIG. 5C by applying a voltage ($V_{ext}$ in FIG. 5C) across the barrier layers at the two ends of the quantum wells. In the quantum wells, the wave functions in the ground state and first excited state deviate in the opposite directions because of the quantum confined effect, and have opposite electric dipoles. In such a structure including quantum wells adjacent to each other, the energy of the |1>a|0>b and |0>a|1>b with the dipoles in the opposite directions becomes smaller than the energy of the |0>a|0>b and |1>a|1>b with the dipoles in the same direction because of the interaction between the electric dipoles. Owing to the interaction, the energy level diagram as illustrated in FIG. 5D is obtained, in which the energy difference $E_b'$ between the |1>a|0>b and |1>a|1>b is greater than the energy difference $E_b''0$ between the |0>a|0>b and |0>a|1>b . Accordingly, pumping with the electromagnetic wave with the frequency $\omega_b'$ corresponding to $E_b'$ (=$\hbar\omega_b'$/$2\pi$=$h\nu_b'$) makes it possible to selectively invert the |b> state only when the |a> is in the |1>a state.

However, trying to implement such logic gates using actual physical systems involves the following problems, and hence no example has been reported that experimentally demonstrates the Barenco proposal using actual physical systems up to now.

More specifically, the conventional Barenco proposal, which utilizes the optical transition between the quantum levels (inter-subband electrons) formed in the conduction band using the quantum well structures (see, FIG. 3), has the following problems because it uses the electronic state of the subband.

First, in the subband, the phonon scattering constitutes a decoherence factor. In general, the energy relaxation time from the first excited state to the ground state in the subband, which is very short on the order of picoseconds, presents a problem in the quantum operation.

Second, the transition wavelength (the wavelength of the inter-subband transition) from the first excited state to the ground state in the subband is determined by the depths of the quantum wells in the conduction band (energy discontinuous value ΔEc in the conduction band between the two semiconductors). The wavelength falls in about a far-infrared region (ultra-long wavelength of about 10 μm) when the semiconductors such as GaAs and InP are used. In this case, it is difficult to carry out the ultra-fast excitation control because of the lack of femtosecond laser technology operating at a speed of less than 100 femtoseconds.

Third, the maximum step number Ns of the quantum computation is estimated to be the quotient when the decoherence time (phase relaxation time) τ, at which the coherence term decays by a factor of e, is divided by the operation time Tg of the basic gate. Although it is considered that the number Ns must be greater than 1000–10000, since the times τ and Tg are each considered to have a limitation of a few picoseconds, the number Ns is becomes less than 10, making it very difficult to implement the large-scale quantum computation.

SUMMARY OF THE INVENTION

As described above, the relaxation time of electrons between the subband levels is very short. On the other hand, considering the interband transition as illustrated in FIG. 3, when the electrons are excited using the light with a frequency corresponding to the interband energy $h\nu_2$, excitons are generated from the electrons excited to the conduction band and from the holes left after the excited electrons in the valence band. The excitons have a much longer life than the free electrons and holes, and hence have a very long energy relaxation time (greater than several hundred picoseconds). In addition, their phase relaxation time is reported to be a few tens of picoseconds in a high-quality quantum film structure. Furthermore, weakly confined excitons (called localized excitons) using the unevenness of the hetero-interface of the quantum film or quantum wire as the confinement potential exhibit the emission characteristics with the same very narrow emission line width as the quantum dot in a cryogenic temperature. The phase relaxation time expected from the emission line width is a few tens to a few hundreds picoseconds. Thus, the localized excitons of the quantum film and quantum wire, or the excitons of the quantum dot have a very long phase relaxation time (from a few tens of picoseconds to a few hundreds of picoseconds).

As described above, using the interband excitons in the quantum well structure instead of using the electrons between the subband levels enables the phase relaxation time to be prolonged by a factor of 10–100, thereby making it possible to solve the first problem of the Barenco et al. proposal.

The wavelength of the interband excitons is about 800 nm for GaAs-based materials, and about 1.1–1.5 µm for InP-based materials. The wavelength band falls in the region enabling the ultrashort optical pulse laser technology and wavelength conversion technology to generate pulses with less than 100 femtosecond easily. In particular, in the 800 nm band, a laser is reported that can generate a pulse with a width of about five femtoseconds (about two optical cycles). Accordingly, using the excitons makes it possible to solve the second problem of the Barenco et al. proposal.

Moreover, using the phase relaxation time of the quantum dot of the order of 100 picoseconds in combination with the laser technology with the pulse width of 5–100 femtoseconds, it is expected that the maximum step number Ns of the quantum computation in a range of 1000–10000 will be possible, thereby making it possible to solve the third problem of the Barenco et al. proposal.

Therefore the present invention relates to a quantum logic gate utilizing the electronic states of the semiconductor quantum structures, and is characterized by utilizing the inter-polarization interaction (dipole-dipole interaction) between excitons with excited polarization in each of two or more semiconductor quantum well structures. In addition, the present invention is characterized by utilizing the spin exchange interaction between spin polarized excitons excited in each of the two or more semiconductor quantum well structures. Furthermore, the semiconductor quantum well structures of the quantum logic gate in accordance with the present invention can be one of the quantum dot structure, quantum wire structure and quantum film structure.

Accordingly, the present invention can solve the problem of the very short phase relaxation time of the inter-subband electrons by using the very long phase relaxation time of the interband excitons. The problem of the conventional subband in that the wavelength of the control light becomes far-infrared can be solved because using the interband excitons makes it possible to use the visible to infrared wavelength, to which wavelength band the ultrashort pulse laser technology is applicable. Consequently, it becomes possible to increase the decoherence time (phase relaxation time) sharply and to reduce the basic operation time sharply by the ultrashort pulse laser technology, thereby increasing the number of steps of the quantum computation sharply.

The above and other objects, effects, features and advantages of the present invention will become more apparent from the following description of embodiments thereof taken in conjunction with the accompanying drawings.

BRIEF DESCRIPTION OF THE DRAWINGS

FIGS. 2A and 2B are diagrams showing a controlled Not corresponding to the two-quantum bit operation of a quantum logic gate;

FIGS. 5A–5D are diagrams illustrating a proposal of a conventional two-quantum bit quantum logic gate by Barenco: FIG. 5A is an energy band diagram when no electric field is applied; FIG. 5B is an energy diagram of a system when no dipole-dipole interaction is present; FIG. 5C is an energy band diagram when electron levels are placed in a resonant coupled state by applying an electric field; and FIG. 5D is an energy diagram of the system when an dipole-dipole interaction is present;

FIGS. 6A–6D are diagrams illustrating a configuration of a two-quantum bit gate using excitons with self polarization: FIG. 6A is an energy band diagram without any electric field applied; FIG. 6B is an energy band diagram when the electron levels are placed at a resonant coupled state by applying an electric field; FIG. 6C is an energy diagram of the system when no dipole-dipole interaction is present; and FIG. 6D is an energy diagram of the system when a dipole-dipole interaction is present;

FIG. 7A is an energy band diagram; FIG. 7B is an energy diagram of the system when no spin exchange interaction is present; and FIG. 7C is an energy diagram of the system when a spin exchange interaction is present;

FIGS. 8A–8D are diagrams illustrating a configuration of a two-quantum bit gate using excitons passing through spin selective excitation, when the quantum levels of the electronic system agree between two quantum wells: FIG. 8A is an energy band diagram in an initial state when no bias is applied; FIG. 8B is an energy band diagram when the quantum levels of the electronic system are matched between two quantum wells by applying a bias; FIG. 8C is an energy diagram when no spin exchange interaction is present; and FIG. 8D is an energy diagram when a spin exchange interaction is present;

FIGS. 10A–10D are diagrams illustrating a two-quantum bit configuration method when a magnetic field is applied to the semiconductor quantum well structure: FIG. 10A is an energy band diagram when no magnetic field is applied; FIG. 10B is an energy band diagram when the electron levels are placed at a resonant coupled state by applying a magnetic field; FIG. 10C is an energy diagram of the system when no dipole-dipole interaction is present; and FIG. 10D is an energy diagram of the system when a dipole-dipole interaction is present;

FIGS. 11A–11C are diagrams illustrating a two-quantum bit configuration method using a spin exchange interaction when a magnetic field is applied to a semiconductor quantum well structure: FIG. 11A is an energy band diagram when no magnetic field is applied; FIG. 11B is an energy band diagram when electron levels are placed at a resonant coupled state by applying a magnetic field; and FIG. 11C is an enlarged energy band diagram of the conduction band;

FIG. 15A illustrates an organizing method of a terrace substrate; FIG. 15B illustrates the self organization; and FIG. 15C illustrates a multilayer stacking method; FIG. 16A illustrates a gate structure; and FIG. 16B is an enlarged view of quantum dots, an example of coupled quantum wells.

DETAILED DESCRIPTION OF PREFERRED EMBODIMENTS

Figure 1:
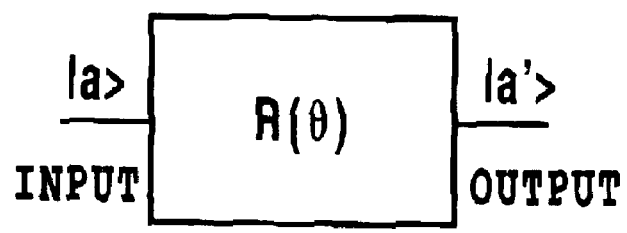
FIG. 1 is a diagram showing a phase shifter corresponding to the one-quantum bit operation of a quantum logic gate.
Figure 3:
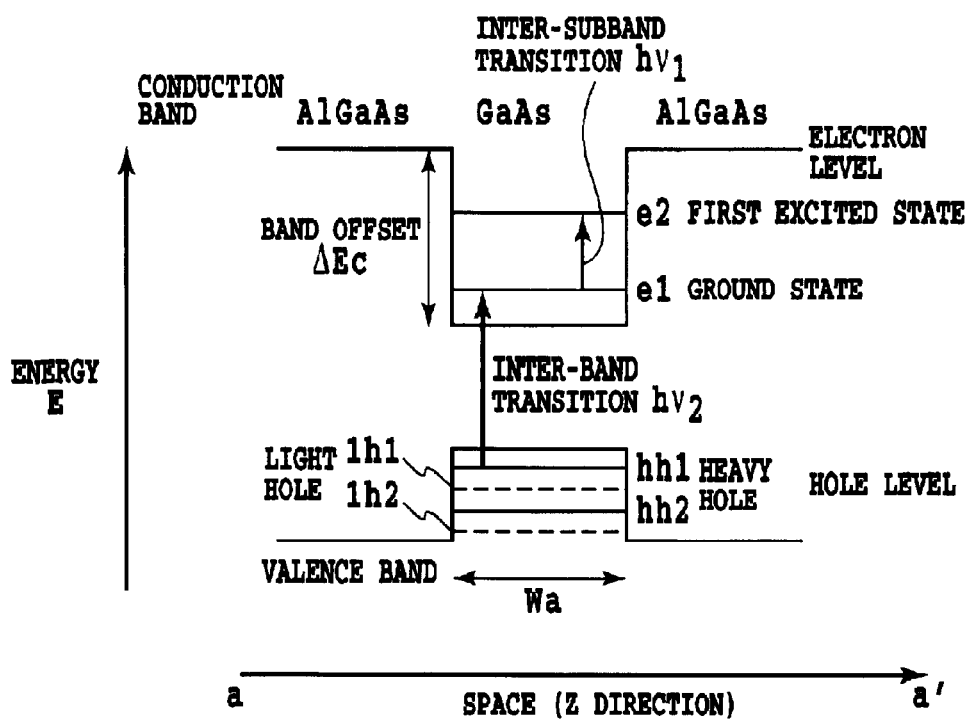
FIG. 3 is an energy band diagram illustrating a quantum well structure.

The invention will now be described with reference to the accompanying drawings.

Embodiment 1

In a quantum well structure, an exciton system differs from an electron system. Thus, a selection method of the ground state and an excitation state, and a configuration method of a one-quantum bit gate (phase shifter) and a two-quantum bit gate (controlled Not) are as follows.

As the configuration method, the following two methods are conceivable chiefly: (A) A method of utilizing dipole interaction between two excitons having polarization; and (B) a method of utilizing a spin exchange interaction between two excitons with spin polarization. As for (B), the following two cases are conceivable: (B-1) When the quantum levels of the electronic system disagree between two quantum wells; and (B-2) when the quantum levels of the electronic system agree between two quantum wells.

FIGS. 6A–6D are energy band diagrams for illustrating the configuration method (A). First, a structure is prepared including two adjacent quantum wells a and b with different widths as illustrated in FIG. 6A. The quantum wells are preferably a quantum dot that confines an electron in the three directions because it enables excitation control of only one excitation electron and it has a long phase relaxation time. However, a quantum film or a quantum wire is principally possible.

When no electric field is applied, the wider quantum well has a lower electron energy level than the narrower quantum well. On the contrary, as for the hole energy level, the wider quantum well has a higher level than the narrower quantum well. As for the transition energy, the energy $E_a$ of the wider quantum well a is lower than the energy $E_b$ of the narrower quantum well b.

Next, an electric field is applied to the quantum wells in the direction from b to a as illustrated in FIG. 6B. In this case, as for the electron system, the energy of the well a increases and the energy of the well b decreases, so that a resonant condition is obtained in which the electron energy levels of the two quantum wells agree with each other. In this case, as illustrated in FIG. 6B, the wave functions of the electrons vary to two coupled states—a symmetric state (low energy coupled state) and an anti-symmetric state (high energy coupled state). The wave functions of the coupled states are characterized by extending across the two quantum wells (unlocalized), so that they are not localized in one well. In contrast, the hole energy levels shift in the opposite direction to the electron energy levels so that the energy difference between the quantum wells a and b increases. In this case, since the holes do not make resonant coupling between the two quantum wells, they are localized in one well each.

In this case, a state in which an exciton, which consist of a hole in the quantum well a and an electron in the symmetric coupled state extending across the wells a and b, are excited is designated by $|1>a$, and a state in which the excitons are not excited is designated by $|0>a$. Likewise, a state in which the excitons, which consist of a hole in the quantum well b and an electron in the anti-symmetric coupled state extending across the wells a and b, are excited is designated by $|1>b$, and a state in which the excitons are not excited is designated by $|0>b$. In this case, the energy levels become as illustrated in FIG. 6C without considering a dipole-dipole interaction.

Since these excitons consist of unlocalized electrons and localized holes, the center of mass of the electrons and holes deviates so that they have a polarization (self polarization) as indicated by the arrows of FIG. 6B. Here, the $|0>a|0>b$ occurs when neither the well a nor b includes the excitons, the $|0>a|1>b$ occurs when the well a includes no excitons but the well b includes an exciton, the $|1>a|0>b$ occurs when the well a includes an exciton but the well b includes no excitons, and the $|1>a|1>b$ occurs when the wells a and b each include an exciton. In this case, the term "the well a and b include an exciton" refers to a state in which the well a includes an exciton formed by a hole localized in well a, and the well b includes an exciton formed by a hole localized in well b. In this state, irradiating the electromagnetic wave corresponding to the energy difference $E_b(=\hbar\omega_b/2\pi)$ between the $|0>b$ and $|1>b$ for a fixed time period corresponding to a $\pi$ pulse, the $|b>$ state can be changed from $|0>b$ to $|1>b$ or vice versa. Thus the operation of the phase shifter is implemented.

The electric field applied to the quantum wells forms the self polarization, and the dipoles point in the opposite directions as illustrated in FIG. 6B. When the two independent excitons align in the opposite directions, the energy is reduced by an amount of the dipole-dipole interaction $\delta$. Accordingly, the system has the energy levels as illustrated in FIG. 6D in which the energy difference $E_b'$ between the $|1>a|0>b$ and $|1>a|1>b$ is smaller than the energy difference $E_b$ between the $|0>a|0>b$ and $|0>a|1>b$. Consequently, the excitation using the electromagnetic wave with the frequency $\omega_b'$ corresponding to $E_b'$ $(=\hbar\omega_b'/2\pi)$ enables the $|b>$ state to be selectively inverted only when the $|a>$ is in the $|1>a$ state.

In the configuration methods of the two-quantum bit gate, another configuration method can be implemented by varying the selecting method of the symmetric state and anti-symmetric state. Assume that a state in which an exciton, which consist of a hole in the quantum well a and an electron in the anti-symmetric coupled state extending across the two wells a and b, is excited is designated by $|1>a$, and a state in which the excitons are not excited is designated by $|0>a$. Likewise, a state in which an exciton, which consist of a hole in the quantum well b and an electron in the symmetric coupled state extending across the wells a and b, is excited is designated by $|1>b$, and a state in which the excitons are not excited is designated by $|0>b$. In this case, the one-quantum bit gate and two-quantum bit gate can be configured in the same manner as described above.

However, the energy difference between $E_{a2}$ and $E_{b1}$ is smaller than the energy difference between $E_{a1}$ and $E_{b2}$ in the latter method. Thus, the latter method has a disadvantage in selectively optically controlling the levels. However, it can configure the two-quantum bit by appropriately selecting the energy differences.

Figure 7A:
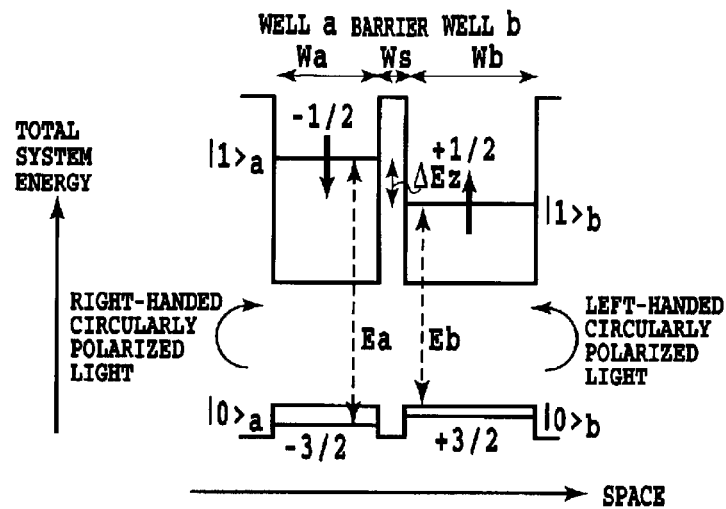
FIGS. 7A–7C are diagrams illustrating a configuration of a two-quantum bit gate using excitons passing through spin selective excitation, when the quantum levels of the electronic system disagree between two quantum wells.
Figure 7B:
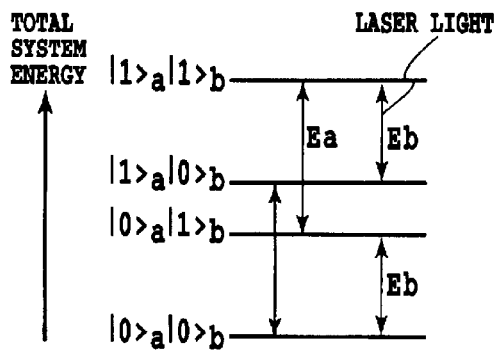
Figure 7C:
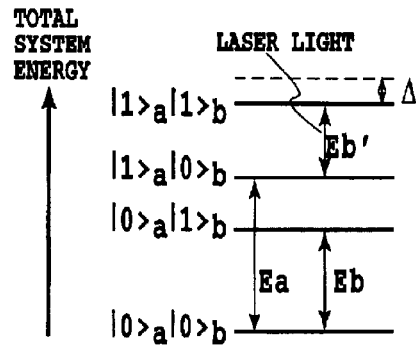

Next, in the configuration method (B), the (B-1) method will be described in which the quantum levels of the electronic system do not agree between the two quantum wells. FIGS. 7A–7C are diagrams illustrating a configuration method of a two-quantum bit gate utilizing a spin exchange interaction. The quantum structure is preferably a quantum dot that confines an electron in the three directions because it enables excitation control of only a single excitation electron and it has a long phase relaxation time. However, a quantum film or a quantum wire is principally possible.

As for the quantum film, since heavy holes separate from light holes, it can carry out the spin selective excitation. In contrast, as for the quantum wire and quantum dot, they have a structure in which quantum wires or quantum dots are stacked adjacently (coupled) in the stack (Z) direction, in which direction (growing direction of the crystal) their thicknesses are less than their thicknesses in the X or Y direction in order to realize the spin selective excitation. In addition, the sizes of the two quantum wells (thicknesses Wa and Wb in the Z direction) are altered to enable the energy to selectively excite one of the two wells. The barrier layer thickness b is selected at a value that will bring about the spin exchange interaction between the two quantum wells (less than a few nanometers).

In this case, using left-handed and right-handed circularly polarized light and selecting the central wavelength of the excitation light as control light makes it possible to selectively excite the excitons with an electron having a lower directed spin (down-spin) in the quantum well a and with an electron having an upper directed spin (up-spin) in the quantum well b. On the contrary, a method can also be possible that selectively excites the excitons with the up-spin in the quantum well a and with the down-spin in the quantum well b. Although the former will be described from now on, the latter is also applicable in constructing the quantum logic gates.

As for the electronic states $|a>$ and $|b>$ confined in the quantum wells, assume that the states without excitons (unexcited state) is denoted by $|0>a$ and $|0>b$, and that the states with a spin polarized exciton is denoted by $|1>a$ and $|1>b$. A down-spin polarized exciton is excited in the quantum well a, and a up-spin polarized exciton is excited in the quantum well b. In this case, neglecting the spin exchange interaction, the energy levels become as illustrated in FIG. 7B. In FIG. 7B, the $|0>a|0>b$ indicates a state in which no exciton is present either in the quantum well a nor b. The $|0>a|1>b$ indicates a state in which no exciton is present in the quantum well a, but an up-spin polarized exciton is present in the quantum well b. The $|1>a|0>b$ indicates a state in which a down-spin polarized exciton is present in the quantum well a, but no exciton is present in the quantum well b. The $|1>a|1>b$ indicates a state in which a down-spin polarized exciton is present in the quantum well a, and an up-spin polarized exciton is present in the quantum well b. In these states, it is possible to change the state $|b>$ from $|0>b$ to $|1>b$ or vice versa by irradiating with an electromagnetic wave with energy corresponding to the energy difference $E_b$ ($=h\omega_b/2\pi$) between the states $|0>b$ and $|1>b$ (that is, the electromagnetic wave with specified deflection of right-handed or left-handed circular polarization that can excite specified spin polarization in the quantum well b) for a fixed time (time period corresponding to the $\pi$ pulse). Thus the operation of the phase shifter is implemented.

When the spins of the excitons in the two coupled quantum wells are excited in the opposite polarization (up-spin and down-spin), artificial exciton molecules are formed, so that the energy of the system is reduced from the energy of the two independent excitons by an amount $\Delta$. Accordingly, considering the spin exchange interaction, the energy levels of the system become as illustrated in FIG. 7C, in which the energy difference $E_b'$ between the states $|1>a|0>b$ and $|1>a|1>b$ is lower than the energy difference $E_b$ between the states $|0>a|0>b$ and $|0>a|1>b$. Consequently, the state $|b>$ can be selectively inverted only when the state $|a>$ is $|1>a$ by exciting it using the electromagnetic wave with the frequency $\omega_b'$ corresponding to the energy $E_b'$ ($=h\omega_b'/2\pi$).

Next, in the configuration method (B), the (B-2) method will be described in which the quantum levels of the electronic system agree between the two quantum wells. FIGS. 8A–8D are diagrams illustrating a configuration method of a two-quantum bit gate utilizing the spin exchange interaction. The quantum structure is preferably a quantum dot that confines an electron in the three-dimensional directions because it enables excitation control of only one excitation electron and it has a long phase relaxation time. However, a quantum film or a quantum wire is principally possible.

As for the quantum film, since heavy holes separate from light holes, it can carry out the spin selective excitation. In contrast, as for the quantum wire and quantum dot, they have a structure in which quantum wires or quantum dots are stacked adjacently (coupled) in the stack (Z) direction, in which direction (growing direction of the crystal) their thicknesses are less than their thicknesses in the X or Y direction in order to realize the spin selective excitation. In addition, the sizes of the two quantum wells (thicknesses Wa and Wb in the Z direction) are altered to enable the energy to selectively excite one of the two wells. The distance Ws between the two quantum wells is selected at a quantum mechanically coupleable distance of less than a few nanometers. The energy levels of the two quantum wells differ from each other in the no bias condition as illustrated in FIG. 8A.

As described before in the method utilizing the dipole interaction between the polarized two excitons (FIGS. 6A–6D), an electric field is applied to the quantum wells in the direction from a to b as illustrated in FIG. 8B. In this case, as for the electron system, the energy of the well b increases and the energy of the well a decreases, so that a resonant condition is obtained in which the electron energy levels of the two quantum wells agree with each other. In this case, as illustrated in FIG. 6B, the wave functions of the electrons vary to two coupled states—a symmetric state (low energy coupled state) and an anti-symmetric state (high energy coupled state). The wave functions of the coupled states are characterized by extending across the two quantum wells (unlocalized), so that they are not localized in one well. In contrast, the hole energy levels shift in the opposite direction to the electron energy levels so that the energy difference between the quantum wells a and b increases. In this case, since the holes do not make resonant coupling between the two quantum wells, they are localized in one well each. Consider the transition between the hole levels localized in the quantum wells a and b and the symmetric coupled state of the coupled unlocalized electrons. Although the anti-symmetric coupled state can be used instead of the symmetric state, an example utilizing the symmetric coupled state will be described below.

In this case, using left-handed and right-handed circularly polarized light and selecting the central wavelength of the excitation light as control light makes it possible to selectively excite the excitons with an electron having down-spin for the electron levels of the quantum well a and with an up-spin for the electron levels of the quantum well b. However, since the resonant coupled state is retained, the electrons are unlocalized so that although the electron levels of the quantum wells a and b are identical in energy, their spin directions point different exciton states.

On the contrary, the method can also be possible that selectively excites the excitons with the up-spin for the electron levels of the quantum well a and with the down-spin for the electron levels of the quantum well b. Although the former will be described from now on, the latter is also applicable in constructing the quantum logic gates.

As for the electronic states |a> and |b> confined in the quantum wells, assume that the state without an exciton (unexcited state) is denoted by |0>a and |0>b, that the state with a down-spin polarized exciton generated in the quantum well a is denoted by |1>a, and that the state with a up-spin polarized exciton generated in the quantum well b is denoted by |1>b. In this case, without considering the spin exchange interaction, the energy levels become as illustrated in FIG. 8C.

The individual quantum states are the same as those described in connection with the (B-1) method, in which the quantum levels of the electronic system disagree between the two quantum wells, and the operation of the phase shifter is implemented in the same manner. The energy levels of the system under the spin exchange interaction becomes as illustrated in FIG. 8D. Thus, the selective inversion of the state |b> is possible only when the state |a> is in the |1>a state by the electromagnetic wave excitation as described above in connection with the (B-1) method in which the quantum levels of the electronic system disagree between the two quantum wells.

Utilizing the excitons can decrease the decoherence factor, thus achieving a very long phase relaxation time. The wavelength band of the excitons is around 800 nm in a GaAs system, and 1.1–1.5 $\mu$m in an InP system, which wavelength bands can be handles by the ultrashort optical pulse laser technology that provides a pulse with a width of 100 femtoseconds or less. Accordingly, using a ultrashort pulse enables the basic gate operation in a very short time of about 100 femtoseconds. Consequently, according to the long decoherence time (phase relaxation time) and the very short basic gate operation time, the maximum step number Ns of the quantum computation can be increased to 1000–10000 or more.

So far, the description is made by way of example in which the electric field is applied to the semiconductor quantum well structure as the external field, and that the excitons undergo light excitation in this state. However, the external field is not necessarily an electric field: it may be a magnetic field.

Figure 9:
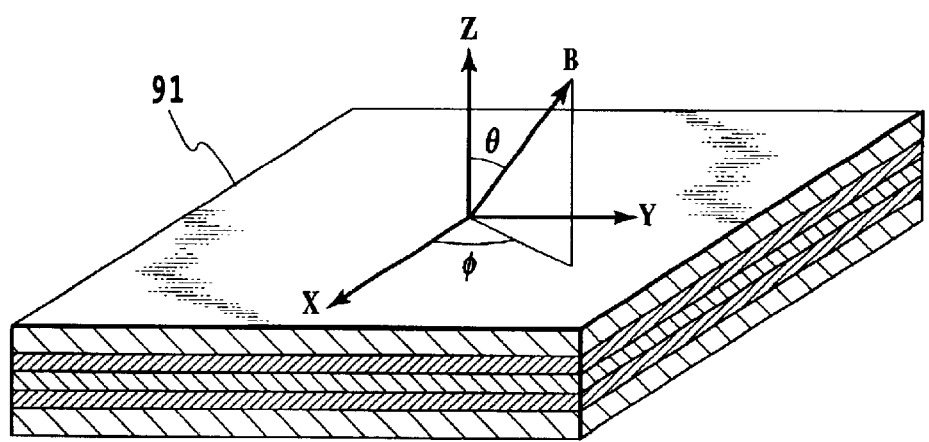
FIG. 9 is a perspective view showing an applying direction of a magnetic field when an external field applied to a semiconductor quantum well structure is a magnetic field.

FIG. 9 is a perspective view illustrating the applying direction of a magnetic field when the external field applied to the semiconductor quantum well structures is a magnetic field. In FIG. 9, the magnetic field is applied in the direction at an angle of $\theta$ to the direction (Z direction) perpendicular to the top surface of a substrate 91, and at an angle $\phi$ to the X direction on the top surface of the substrate 91. Incidentally, although the substrate 91 is assumed to have the quantum well structure stacked in the Z direction, this is not essential. For example, instead of the quantum well, a quantum wire structure extending in the Y direction, or a quantum dot structure quantized not only in the Z direction, but also in the X and Y directions can also be utilized.

Applying the magnetic field brings about the Zeeman splitting that splits the quantization levels of the electrons in the conduction band and of the holes in the valence band into two levels corresponding to the quantum number of the spin. It is possible to configure the quantum logic gates utilizing the energy shift by the Zeeman splitting instead of the energy shift of the quantization levels caused by the electric field applied as the external field. Selecting either the energy splitting of the electrons or the energy splitting of the holes is controllable by appropriately selecting the intensity and direction of the magnetic field (the directions $\theta$=0–360° and $\phi$=0–360°).

FIGS. 10A–10D are diagrams illustrating a two-quantum bit configuration method when applying a magnetic field to the semiconductor quantum well structures. Applying the magnetic field will vary the energy of the electron system and that of the hole system from the condition without the magnetic field by the Zeeman splitting. As for the electron system, the energy level of the quantum well a is split into two energy levels +$\Delta$Eza/2 and −$\Delta$Eza/2, and the energy level of the quantum well b is split into two energy levels +$\Delta$Ezb/2 and −$\Delta$Ezb/2b. The $\Delta$Eza and $\Delta$Ezb are Zeeman splitting energy caused by the magnetic field in the quantum wells a and b, which are drawn by broken lines in FIGS. 10A–10D.

Assume that the energy level difference between the conduction bands of the quantum wells a and b when no magnetic field is applied is $\Delta$Ez. The resonant condition in which the electron energy levels of the two quantum wells agree with each other can be established by applying an appropriate magnetic field in such a manner that the condition $\Delta$Ez=$\Delta$Eza/2+$\Delta$Ezb/2 holds. In this case, the lower energy level of the quantum well a and the higher energy level of the quantum well b of FIG. 10B shift to the two coupled states—the symmetric state (low energy coupled state) and anti-symmetric state (high energy coupled state)—by the coupling as in the resonant condition caused by applying the electric field.

The wave functions of the coupled states are characterized by extending across the two quantum wells (unlocalized), so that they are not localized in one well. In contrast, since the holes do not make resonant coupling between the two quantum wells, they are localized in one well each. Consider the transition between the hole levels localized in the quantum well a and the symmetric state of the coupled unlocalized electrons, and the transition between the hole levels localized in the quantum well b and the anti-symmetric state of the coupled unlocalized electrons. Although the anti-symmetric coupled state can be used instead of the symmetric state, an example utilizing the symmetric coupled state will be described below.

In this case, a state in which an exciton, which consist of a hole in the quantum well a and an electron in the symmetric coupled state extending across the wells a and b, are excited is designated by |1>a, and a state in which the excitons are not excited in well a is designated by |0>a. Likewise, a state in which an exciton, which consist of a hole in the quantum well band an electron in the anti-symmetric coupled state extending across the wells a and b, are excited is designated by |1>b, and a state in which the excitons are not excited in well b is designated by |0>b.

Since these excitons consist of unlocalized electrons and localized holes, the center of mass of the electrons and holes deviates so that they have a polarization (self polarization) as indicated by the arrows of FIG. 10B. Here, the state |0>a|0>b occurs when neither the well a nor b includes the exciton, the state |0>a|1>b occurs when the well a includes no exciton but the well b includes an exciton, the state |1>a|0>b occurs when the well a includes an exciton but the well b includes no exciton, and the state |1>a|1>b occurs when the wells a and b each include an exciton. In this case, the term "the wells a and b include an exciton" refers to a state in which the well a includes an exciton formed by a hole localized in well a, and the well b includes an exciton formed by a hole localized in well b.

In this state, irradiating with the electromagnetic wave corresponding to the energy difference $E_b$ ($=h\omega_b/2\pi$) between the states |0>b and |1>b for the fixed time period corresponding to the π pulse, the |b> state can be changed from |0>b to |1>b or vice versa. Thus the operation of the phase shifter is implemented.

The magnetic field applied to the quantum wells forms the self polarization, and the dipoles point in the opposite directions as illustrated in FIG. 10B. When the two independent excitons align in the opposite directions, the energy is reduced by an amount of the exciton interaction Δ. Accordingly, the system has the energy levels as illustrated in FIG. 10D in which the energy difference $E_b'$ between the |1>a|0>b and |1>a|1>b is smaller than the energy difference $E_b$ between the |0>a|0>b and |0>a|1>b. Consequently, the excitation using the electromagnetic wave with the frequency $\omega_b'$ corresponding to $E_b'$ ($=h\omega_b'/2\pi$) enables the |b> state to be selectively inverted only when the |a> is in the |1>a state.

As described above, another configuration method can be implemented in the configuration methods of the two-quantum bit gate by varying the selecting method of the symmetric state and anti-symmetric state.

FIGS. 11A–11C are diagrams illustrating a configuration method of a two-quantum bit gate utilizing a spin exchange interaction when applying the magnetic field to the semiconductor quantum well structure. The quantum structure is preferably a quantum dot that confines an electron in the three-dimensional directions because it enables excitation control of only one excitation electron and it has a long phase relaxation time. However, a quantum film or a quantum wire is principally possible.

As for the quantum film, since heavy holes separate from light holes, it can carry out the spin selective excitation. In contrast, as for the quantum wire and quantum dot, they have a structure in which quantum wires or quantum dots are stacked adjacently (coupled) in the stack (Z) direction, in which direction (growing direction of the crystal) their thicknesses are less than their thicknesses in the X or Y direction in order to realize the spin selective excitation. In addition, the sizes of the two quantum wells (thicknesses Wa and Wb in the Z direction) are altered to enable the energy to selectively excite one of the two wells. The distance Ws between the two quantum wells is selected at a quantum mechanically coupleable distance of less than a few nanometers. In this case, the energy levels of the two quantum wells differ from each other when no magnetic field is applied as illustrated in FIG. 11A.

Applying the magnetic field to the quantum well structure brings about the Zeeman splitting of the energy levels of the electron system and hole system as illustrated in FIG. 11B. Thus, the energy level of the quantum well a splits into the two levels +ΔEza/2 and −ΔEza/2, and that of the quantum well b splits into the two levels +ΔEzb/2 and −ΔEzb/2, where the symbols ΔEza and ΔEzb denote the Zeeman splitting energy by the magnetic field in the quantum wells a and b, respectively. Assume that the difference between the energy levels of the conduction bands of the quantum wells a and b without the magnetic field is ΔEz. Applying the appropriate magnetic field in such a manner that ΔEz=ΔEza/2+ΔEzb/2 holds, the resonant condition in which the electron energy levels of the two quantum wells agree with each other can be established.

In this case, the lower energy level of the well a and the higher energy level of the well b as illustrated in FIG. 11B are changed to the two coupled states—a symmetric state (low energy coupled state) and an anti-symmetric state (high energy coupled state) as illustrated in FIG. 11C. The wave functions of the coupled states are characterized by extending across the two quantum wells (unlocalized), so that they are not localized in one well. In contrast, since the holes do not make resonant coupling between the two quantum wells, they are localized in one well each.

It is already described above that such a quantum well system enables the operation of the phase shifter, and that the excitation by the electromagnetic wave with the frequency $\omega_b'$ corresponding to the energy difference $E_b'$ ($=h\omega_b'/2\pi$) enables the selective inversion of the |b> state only when the |a> is in the |1>a state.

Figure 4A:
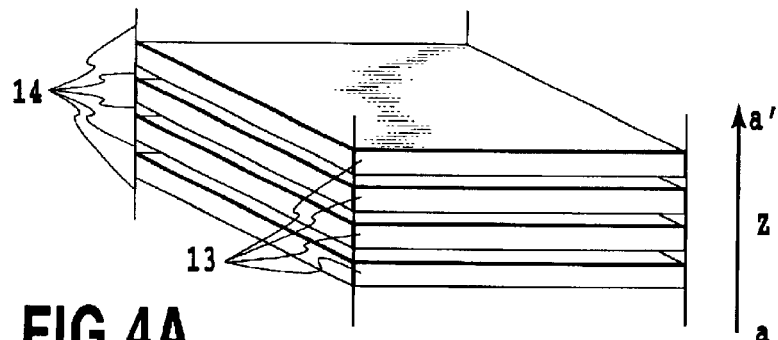
FIG. 4A is a perspective view showing a quantum film structure.

An example of a quantum logic gate structure in accordance with the present invention will now be described. The quantum logic gate using excitons in accordance with the present invention can have a quantum well structure, quantum wire structure or quantum dot structure with a low-dimensional structure as illustrated in FIGS. 4A–4C.

Figure 4B:
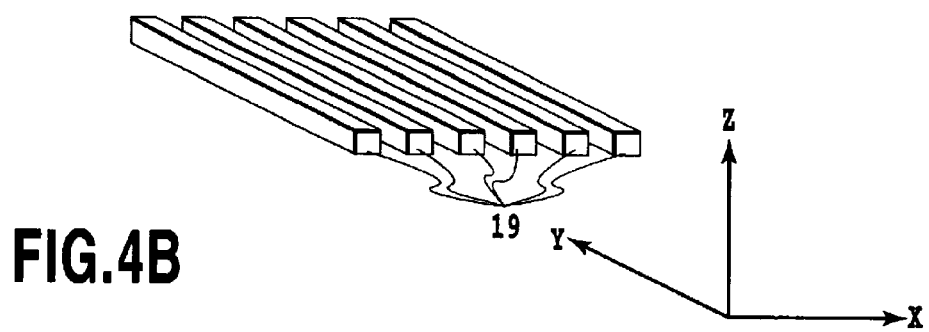
FIG. 4B is a perspective view showing a quantum wire structure.
Figure 4C:
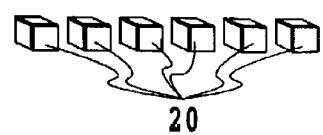
FIG. 4C is a perspective view showing a quantum dot structure.

For example, in FIGS. 4B and 4C, the remainders of GaAs quantum wires 19 and GaAs quantum dots 20 are AlGaAs barrier layers. Incidentally, two or three materials can be selected from GaAs, AlGaAs, InGaAs, InAs, InP, InGaAs P and InAlGaAs so that the material with a narrower band gap is used for structuring the well, and the material with a wider band gap is used for the barrier.

Figure 12:
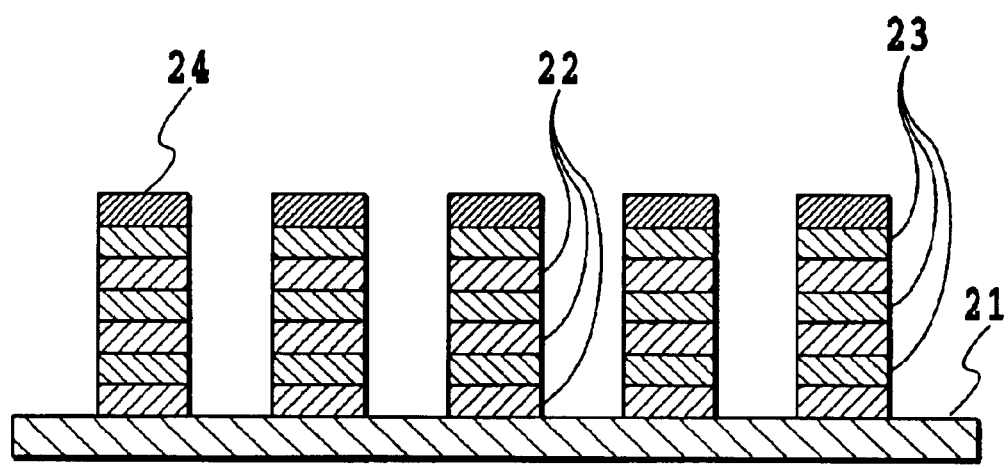
FIG. 12 is a cross-sectional view illustrating a fabrication method of low-dimensional quantum structures by etching.

FIG. 12 shows a fabrication method of the quantum logic gate in accordance with the present invention. Adjacent quantum well structures are formed on a semiconductor substrate 21 by alternately growing quantum well layers 22 and barrier layers 23. Thus, a quantum well type quantum logic gate is formed. Subsequently, a mask 24 is formed by lithography followed by forming the adjacent quantum wire structure by etching process as shown in FIG. 12. Thus, the quantum wire type quantum logic gate is formed. In addition, applying the etching process to the quantum wire structure again in the direction perpendicular to the wire will result in the adjacent quantum dots. Thus, the quantum dot type quantum logic gate is formed.

Figure 13:
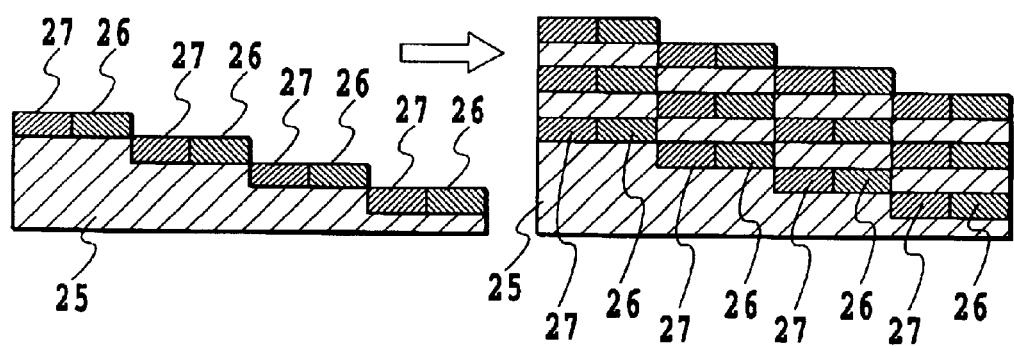
FIG. 13 is a schematic diagram illustrating a fabrication method of low-dimensional quantum wells on a stepwise substrate.

FIG. 13 illustrates another fabrication method of the adjacent quantum well structures, which forms multiple coupling quantum wire structures by alternately growing quantum wire materials 27 and barrier materials 26 on a graded substrate 25. Adjacent quantum dot structures are formed by applying the etching process to the adjacent quantum wire structures in the direction perpendicular to the wires.

Figure 14:
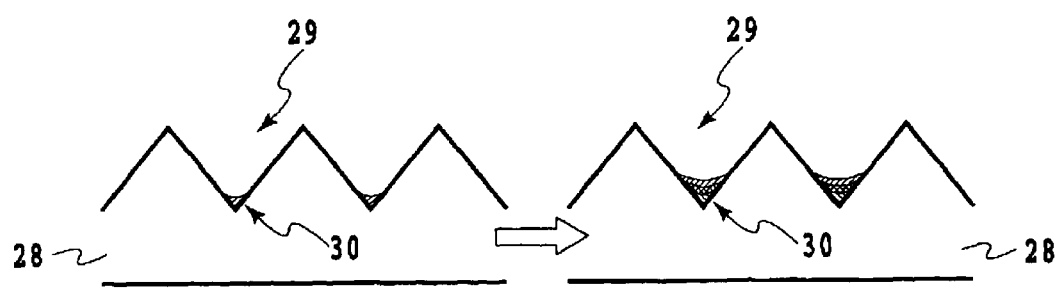
FIG. 14 is a schematic diagram illustrating a fabrication method of low-dimensional quantum wells on a substrate with V grooves.

FIG. 14 illustrates another fabrication method of a quantum wire structure. First, V grooves 29 are formed on a semiconductor substrate 28, and adjacent quantum wires 30 are formed by alternately growing quantum well layers and barrier layers in the V grooves 29. Alternately, it is also possible to form an adjacent quantum dot structure by forming grooves with a shape of a triangular pyramid instead of the V grooves 29 by selecting the crystal face orientation, followed by alternately growing the quantum well layers and barrier layers in the grooves. Thus, the quantum dot type quantum logic gate is fabricated.

Figure 15A:
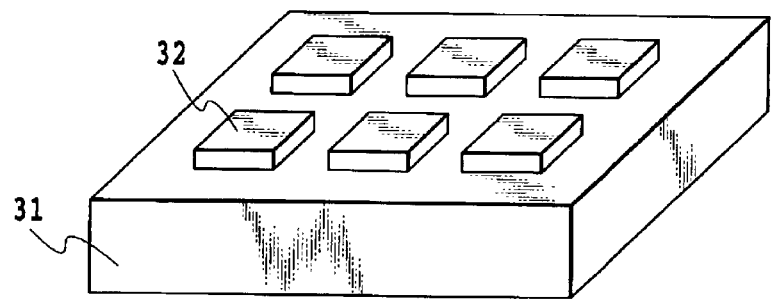
FIGS. 15A–15C are perspective views illustrating a fabrication method of quantum dot structures by self organization on a substrate with terraces.
Figure 15B:
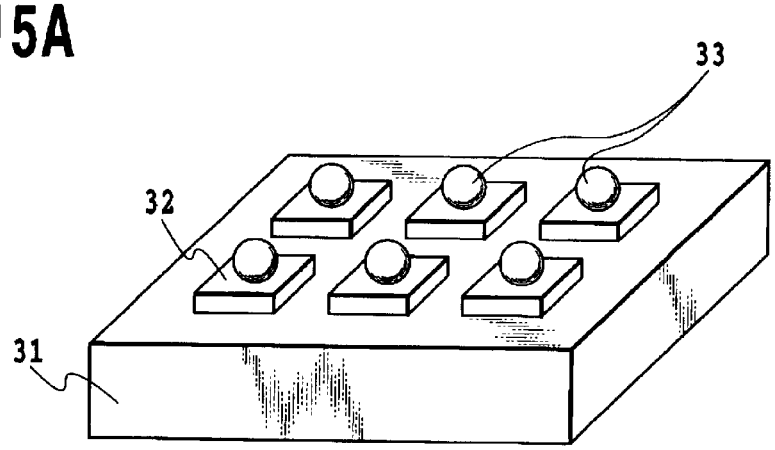
Figure 15C:
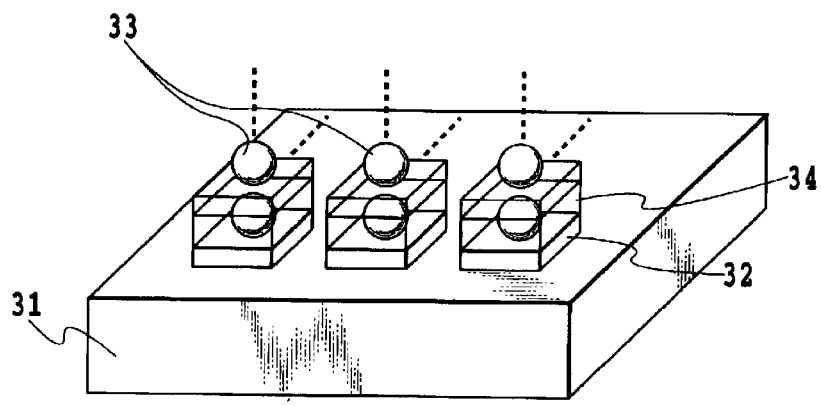

FIGS. 15A–15C show another fabrication method of a quantum dot structure constituting the quantum logic gate in accordance with the present invention. First, a mask having squares therein is formed on a semiconductor substrate 31, followed by etching process and removing the mask, thereby forming semiconductor terraces 32 (FIG. 15A). Subsequently, a quantum dot 33 is formed on each terrace 32 using self organization crystal growth (FIG. 15B). Stacking a barrier layer 34 thereon leaves strain only on the quantum dots 33. Further forming quantum dots 33 on the barrier layer 34 using the self organization crystal growth, the upper quantum dots 33 are formed exactly over the lower quantum dots 33 via the barrier layer 34 because the dots can selectively grown on the strained area. Repeating the growth of the barrier layers 34 and the self organization of the quantum dots 33 can form the quantum dots adjacent to each other in the layer thickness direction (FIG. 15C). Thus, the quantum dot type quantum logic gate is produced.

For example, a multilayer quantum wire structure can be fabricated by using the method of FIG. 14 in the following process. First, the V grooves are formed on a GaAs substrate. Second, a GaAs buffer layer and an AlGaAs buffer layer are formed thereon. Third, GaAs quantum wire (quantum well) layers and AlGaAs barrier layers are grown alternately by n layers each. Thus, the quantum wire structure composed of adjacent ultra-fine n-layer quantum wires and the barrier layers of a few nanometers thick is formed at the bottom of the V grooves, each quantum wire being 5 nm thick and 30 nm wide (effective width is 15 nm).

Figure 16A:
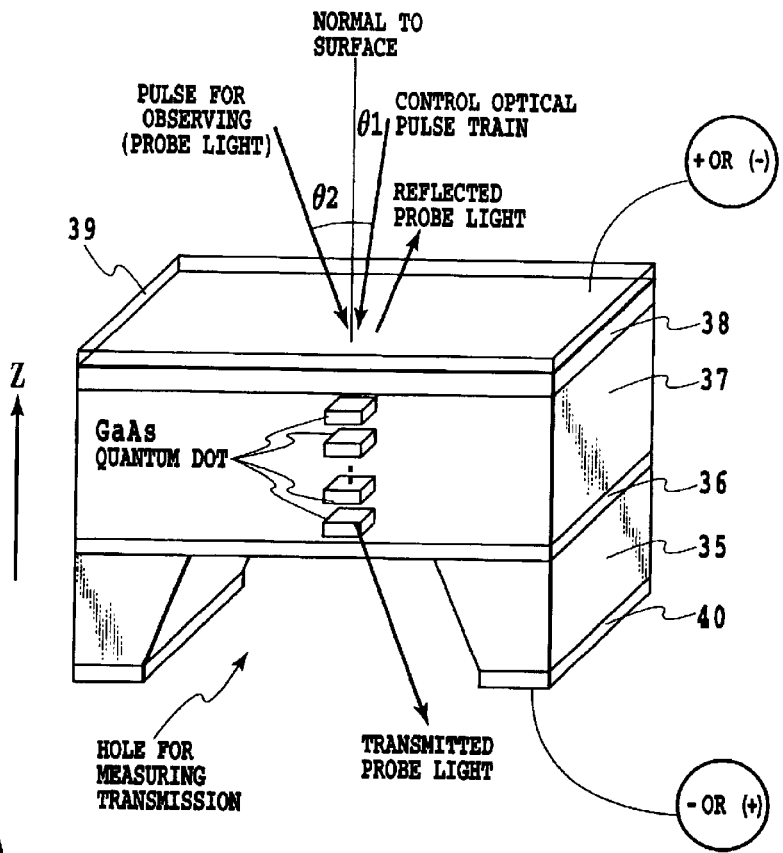
FIGS. 16A and 16B are perspective views illustrating an example of a quantum logic gate.
Figure 16B:
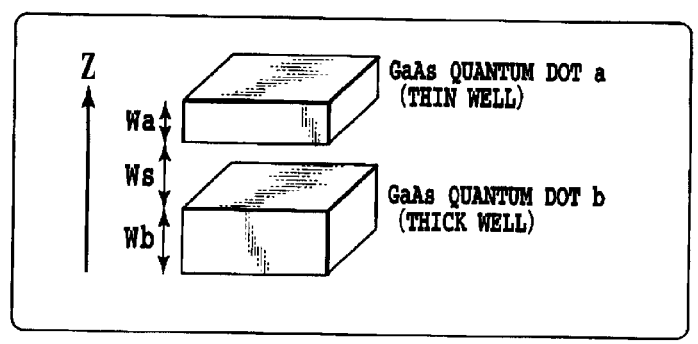

FIGS. 16A and 16B illustrates an example using quantum dots as an example of a concrete quantum logic gate. The gate can also be configured using a quantum wire or quantum film instead of the quantum dots.

First, an etching stop layer 36 (GaAlAs with an Al composition of 0.5) is formed on the top surface of a GaAs substrate 35. Subsequently, a GaAs/AlGaAs quantum dot structure 37 is formed thereon as enlargedly illustrated in FIG. 16B, followed by forming an AlGaAs cladding layer 38 thereon.

Then, a Cr/Au semi-transparent electrode 39 is formed on the surface of the cladding layer 38. In addition, a substrate side electrode 40 is formed on the bottom surface of the substrate 35 with masking a portion for providing a round hole with a resist. Subsequently, the round portion to be holed is etched to the stop etch layer 36 by wet etching. Thus, a quantum logic gate with a built-in quantum dot structure to which an external field can be applied is fabricated.

A control pulse is incident to the substrate 35 (or the surface 38) at an angle θ1, and a probe for observing is incident at an angle θ2. Making the sizes of all the quantum dots different enables the control light pulse to excite the electron-hole pair (exciton) of a specified quantum dot by selecting the wavelength of the control light pulse.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A quantum logic gate utilizing an electronic state of a semiconductor quantum structure comprising:
   a first semiconductor quantum well structure as a control quantum bit, said first semiconductor quantum well structure having a first width;
   a second semiconductor quantum well structure as a target quantum bit having a second width which differs from the first width of the first semiconductor quantum well structure;
   means for generating one exciton with self polarization in each of the first and second semiconductor quantum well structures; and
   means for inverting the target quantum bit from |1> state to |0> state or from |0> state to |1> state only when the control quantum bit is in the |1> state by irradiating an electromagnetic wave corresponding to a shifted energy difference to the second semiconductor quantum well structure,
   where the |0> state is a state in which the exciton is not excited and the |1> state is a state in which the exciton is excited for the first and second semiconductor well structures, wherein
   the shifted energy difference is shifted by an amount of an inter-polarization (dipole-dipole) interaction between the excitons which occurs only when the exciton is generated simultaneously one by one both in the first and second semiconductor quantum well structures, from an energy difference between the |0> state and the |1> state without the inter-polarization (dipole-dipole) interaction.

2. The quantum logic gate as claimed in claim 1, further comprising means for irradiating the electromagnetic wave corresponding to the energy difference between the |0> state and the |1> state to either the first or the second semiconductor quantum well structures to change the sate of the semiconductor quantum well structures irradiated from the |0> state to the |1> state or vice versa.

3. The quantum logic gate as claimed in claim 1, wherein the exciton with the self polarization is optically excited in an external field applied to said semiconductor quantum well structures.

4. The quantum logic gate as claimed in claim 3, wherein the external field is one of an electric field and a magnetic field.

5. The quantum logic gate as claimed in claim 1, wherein said first and second semiconductor quantum well structures are one of a quantum film structure, a quantum wire structure and a quantum dot structure.

6. The quantum logic gate as claimed in claim 5, wherein said first and second quantum well structures are each composed of an alternate stack of n quantum well layers and n barrier layers, and wherein thicknesses of the quantum well layers differ from each other or differ alternately.

7. The quantum logic gate as claimed in claim 1, wherein the inter-polarization (dipole-dipole) interaction is inter-polarization (dipole-dipole) interaction between excitons which are generated by unlocalized (delocalized) electrons of said first and second semiconductor quantum well structures.

8. The quantum logic gate as claimed in claim 7, wherein the exciton with the self polarization is optically excited in an external field applied to said semiconductor quantum well structures.

9. The quantum logic gate as claimed in claim 8, wherein the external field is one of an electric field and a magnetic field.

10. The quantum logic gate as claimed in claim 7, wherein said first and second semiconductor quantum well structures are one of a quantum film structure, a quantum wire structure and a quantum dot structure.

11. The quantum logic gate as claimed in claim 10, wherein said first and second quantum well structures are each composed of an alternate stack of n quantum well layers and n barrier layers, and wherein thicknesses of the quantum well layers differ from each other or differ alternately.

* * * * *